United States Patent [19]
Marta et al.

[11] Patent Number: 5,745,515
[45] Date of Patent: Apr. 28, 1998

[54] SELF-LIMITING INTRINSICALLY EYE-SAFE LASER UTILIZING AN INCREASING ABSORPTION LAYER

[75] Inventors: Teresa M. Marta, White Bear Lake; Robert A. Morgan, Plymouth, both of Minn.

[73] Assignee: Honeywell Inc., Minneapolis, Minn.

[21] Appl. No.: 683,277

[22] Filed: Jul. 18, 1996

[51] Int. Cl.$^6$ .................................................... H01S 3/19
[52] U.S. Cl. ........................ 372/45; 372/46; 372/96
[58] Field of Search ........................ 372/96, 50, 45, 372/46, 34

[56] References Cited

U.S. PATENT DOCUMENTS

| | | | |
|---|---|---|---|
| 5,031,187 | 7/1991 | Onenstein et al. | 372/50 |
| 5,115,442 | 5/1992 | Lee et al. | 372/45 |
| 5,237,581 | 8/1993 | Asada et al. | 372/45 |
| 5,245,622 | 9/1993 | Jewell et al. | 372/45 |
| 5,258,990 | 11/1993 | Albright et al. | 372/46 |
| 5,331,654 | 7/1994 | Jewell et al. | 372/45 |
| 5,351,256 | 9/1994 | Schneider et al. | 372/45 |
| 5,359,447 | 10/1994 | Hahn et al. | 359/154 |
| 5,574,738 | 11/1996 | Morgan | 372/50 |

OTHER PUBLICATIONS

J. Jewell et al., "Surface-emitting Microlasers for photonic switching and interchip connections", Mar. 1990, Optical Engineering, vol. 29, No. 3, pp. 210–214.

D. Miller et al., "Optical bistability due to increasing absorption", May 1984, Optics Letters, vol. 9, No. 5, pp. 162–164.

R. Morgan et al., "Vertical–cavity surface–emitting laser arrays", (1995) SPIE, vol. 2398-09, Bellingham WA (no month) pp. 65–93.

R. Morgan et al., "Devices for Optical Processing", Jul. 1991, SPIE, vol. 1562, pp. 149–159.

R. Morgan et al., "Transverse Mode Control of Vertical–Cavity Top–Surface–Emitting Lasers", IEEE Photonics Technology Letters, vol. 4, No. 4, Apr. 1993, pp. 374–377.

R. Morgan et al., 200° C., 96–nm Wavelength Range, Continuous–Wave Lasing from Unbonded GaAs MOVPE–Grown Vertical Cavity Surface–emitting lasers, IEEE Photonics Technology Letters, vol. 7, No. 5, May 1995, pp. 441–443.

*Primary Examiner*—James W. Davie
*Attorney, Agent, or Firm*—William D. Lanyi; Roland W. Norris

[57] ABSTRACT

A laser is manufactured with an increasing absorption layer disposed within one of the mirrors of the laser. The increasing absorption layer exhibits an increasing absorption coefficient in response to increasing current through the laser by increasing the temperature or carrier concentration of the layer. The increasing absorption coefficient of the increasing absorption layer prevents the output power from the laser from exceeding a preselected magnitude. The absorption coefficient of the increasing absorption layer increases as a function of increasing current and eventually quenches the operation of the laser to provide an inherently eye-safe laser. The laser may also exploit the increasing absorption layer to exhibit optical gating, switching or bistability. In a preferred embodiment of the present invention, the laser is a vertical cavity surface emitting laser.

22 Claims, 9 Drawing Sheets

SELF-LIMITING INTRINSICALLY EYE-SAFE LASER UTILIZING AN INCREASING ABSORPTION LAYER

BACKGROUND OF THE INVENTION

1. Field of the Invention

The present invention is generally related to lasers and, more particularly, to vertical cavity surface emitting lasers, or VCSEL's, that comprise a layer which limits the power output from the laser as a function of a preselected operating parameter, such as current, voltage or temperature.

2. Description of the Prior Art

Vertical cavity surface emitting lasers, or VCSEL's, are well known to those skilled in the art. An article titled "Surface-emitting Microlasers for Photonic Switching and Interchip Connections", published in Optical Engineering, March 1990, Volume 29 No. 3 by Jewell, Scherer, McCall, Olsson, Harbison and Florez describes vertical cavity electrically pumped surface emitting microlasers which are formed on gallium arsenide substrates at densities greater than two million per square centimeter. Two wafers were grown with indium gallium arsenide active material composing three quantum wells, 80 angstroms thick, in one and a single quantum well 100 angstroms thick in the other. Lasing was seen in devices as small as 1.5 micrometers diameter with less than 0.05 micrometers cube active material. Single quantum well microlasers 5×5 micrometer square had room temperature current thresholds as low as 1.5 milliampere with 983 nanometers output wavelength. Ten-by-ten micrometer square single quantum well microlasers were modulated by a pseudorandom bit generator at one Gb/s with less than $10^{-10}$ bit error rate. Pulsed output>170 milliwatt was obtained from a 100 micrometer square device. The laser output passes through a nominally transparent substrate and out of its back side, a configuration well suited for micro optic integration and photonic switching and interchip connections.

In an article titled "Optical Bistability Due to Increasing Absorption" which appeared in Optics Letters, Volume 9, No. 5, in May 1984, Miller, Gossard and Wiegmann showed theoretically that optical bistability will exist in a material whose optical absorption is more than linearly proportional to the degree to which the material is excited. No cavity or external feedback is required. The underlying principle of this bistability appears to be a generalization of several previous independent discussions of mirrorless bistabilities in specific physical systems. This bistability is demonstrated experimentally using a thermal nonlinearity in a gallium arsenide/gallium aluminum arsenide multiple quantum well semiconductor. Theory and experiment are described as showing agreement.

In an article titled "Vertical-Cavity Surface-Emitting Laser Arrays" by Morgan and Hibbs-Brenner, which appeared in SPIE Volume 2398, pages 65–93, on Feb. 6, 1995, the authors reviewed the state-of-the-art performance of producible 850 nanometer current guided gallium arsenide/aluminum gallium arsenide top emitting vertical cavity surface emitting lasers and arrays. The paper focuses on the flexibility of this technology platform in demonstrating a variety of devices and arrays. A 99.8 percent device yield across a three inch diameter metal organic vapor phase epitaxy grown wafer is demonstrated with this design. Recent progress in device performance have and will enable advances in VCSEL array based technologies. Included in the paper are unique ways of engineering lasing characteristics for single mode or incoherent emission. Array applications include one dimensional addressable arrays, particularly in the area of high speed optical data links.

In SPIE (Society of Photo-Optical Instrumentation Engineers) Volume 1562 (1991), an article titled "Devices for Optical processing" by Morgan, Chirovsky, Focht, Guth, Asom, Leibenguth, Robinson, Lee and Jewell reports on batch processed, totally planar, vertical cavity top surface emitting gallium arsenide/aluminum gallium arsenide laser devices and arrays. Different size devices are studied experimentally. The article describes the measurement of continuous wave threshold currents as low as 1.7 milliamperes and output powers greater than 3.7 milliwatts at room temperature. The article also discusses interesting characteristics such as differential quantum efficiencies exceeding unity and multitransverse mode behavior. An array having a 64 by 1 individually accessed elements is characterized and shown to have uniform room temperature continuous wave operating characteristics in threshold currents approximately equal to 2.1 milliamperes with a wavelength of approximately 849.4 nanometers and an output power of approximately 0.5 milliwatts.

U.S. Pat. No. 5,115,442, which was issued to Lee et al on May 19, 1992, discloses a top emitting surface emitting laser structure. Lasers of this type depend upon emission through apertured top surface electrodes. Biasing current, accordingly peripheral to the laser is introduced, follows the path which comes to confluence within the active region to effectively attain lasing threshold. The path is the consequence of a buried region of increasing resistance which encircles the laser at or above the active region. The buried region is produced by ion implantation-induced damage with ion energy magnitude and spectrum chosen to produce an appropriate resistance gradient integrated, as well as discrete, laser are contemplated by the patent. U.S. Pat. No. 5,115,442 is hereby explicitly incorporated by reference.

U.S. Pat. No. 5,031,187, which was issued to Orenstein et al on Jul. 9, 1991, discloses a planar array of vertical cavity_surface emitting lasers. The device comprises an active region having a quantum well region disposed between two Bragg reflector mirrors separated by a wavelength of the emitting laser. A large area of the structure is grown on a substrate and then laterally defined by implanting conducting reducing ions into the upper mirror in areas around the lasers. Thereby, the laterally defined laser array remains planar. Such an array can be made matrix addressable by growing the structure on a conducting layer overlying an insulating substrate. After growth of the vertical structure, an etch or further implantation divides the conducting layer into strips forming bottom column electrodes. Top row electrodes are deposited in the perpendicular direction over the laterally defined top mirror. U.S. Pat. No. 5,013,187 is hereby explicitly incorporated by reference.

In IEEE Photonics Technology Letters, volume 4, no. 4 (April 1993), an article titled "Transverse Mode Control of Vertical-Cavity Top-Surface-Emitting Lasers" by Morgan, Guth, Focht, Asom, Kojima, Rogers and Callis discusses transverse mode characteristics and the control for vertical cavity top surface emitting lasers. It also describes a spatial filtering concept for the control of VCSEL transverse modes allowing the achievement of over 1.5 mW single TEM transverse mode emission from continuous wave electrically excited VCSEL's. It also shows that, without spatial filtering, L-I and V-I kinks can be observed.

U.S. Pat. No. 5,245,622, which was issued to Jewell et al on Sep. 14, 1993, describes a vertical cavity surface emitting laser with intra-cavity structures. The intra-cavity structures allow the vertical cavity surface emitting laser to achieve low series resistance, high power efficiencies and $TEM_{00}$ mode radiation. In one embodiment of the invention, a VCSEL comprises a laser cavity disposed between an upper and a lower mirror. The laser cavity comprises upper and lower spacer layers sandwiching an active region. A stratified electrode for conducting electrical current to the active region is disposed between the upper mirror and the upper spacer. The stratified electrode comprises a plurality of alternating high and low doped layers for achieving low series resistance without increasing the optical absorption. The VCSEL further comprises a current aperture as a disc shaped region formed in the stratified electrode for suppressing higher mode radiation. The current aperture is formed by reducing or eliminating the conductivity of the annular surrounding regions. In another embodiment, a metal contact layer having an optical aperture is formed within the upper mirror of the VCSEL. The optical aperture blocks the optical field in such a manner that it eliminates higher transverse mode lasing. U.S. Pat. No. 5,245,622 is hereby explicitly incorporated by reference.

U.S. Pat. No. 5,237,581, which was issued to Asada et al on Aug. 17, 1993, describes a semiconductor multilayer reflector and a light emitting device. The reflector includes a plurality of first quarter wavelength layers each having a high refractive index, a plurality of second quarter wavelength layers each having a low refractive index and high concentration impurity doping regions. The first and second layers are piled up alternately and each of the doping regions is formed at a heterointerface between the first and second layers. In this structure, the width and height of the potential barrier at the heterointerface becomes small so that tunnel current flowing through the multilayer reflector is increased. U.S. Pat. No. 5,237,581 is hereby explicitly incorporated by reference.

U.S. Pat. No. 5,258,990, which was issued to Olbright et al on Nov. 2, 1993, describes a visible light surface emitting semiconductor laser. The laser comprises a laser cavity sandwiched between two distributed Bragg reflectors. The laser cavity comprises a pair of spacer layers surrounding one or more active, optically emitting quantum well layers having a bandgap in the visible range which serves as the active optically emitting material of the device. The thickness of the laser cavity is defined as an integer multiplied by the wavelength and divided by twice the effective index of refraction of the cavity. Electrical pumping of the laser is achieved by heavily doping the bottom mirror and substrate to one conductivity type and heavily doping regions of the upper mirror with the opposite conductivity type to form a diode structure and applying a suitable voltage to the diode structure. Special embodiments of the invention for generating red, green and blue radiation are also described in this patent. U.S. Pat. No. 5,258,990 is hereby explicitly incorporated by reference.

U.S. Pat. No. 5,331,654, which was issued to Jewell et al on Jul. 19, 1994, discloses a polarized surface emitting laser. It describes a vertical cavity surface emitting semiconductor diode laser having a monolithic and planar surface and having lateral anisotropy in order to control the polarization of the emitted light beam. The diode laser includes a body of a semiconductor material having an active region therein which is adapted to generate radiation and emit the radiation from a surface of the body, and a separate reflecting mirror at opposite sides of the active region with at least one of the mirrors being partially transparent to the generated light to allow the light generated in the active region to be emitted therethrough. The anisotropy may be provided by utilizing anisotropy in the atomic or molecular structure of the materials forming the laser or by anisotropic patterning or deliberate offset alignment in processing of the laser or through anisotropic structures in the laser cavity to control the polarization of the emitted beam. U.S. Pat. No. 5,331,654 is hereby explicitly incorporated by reference.

U.S. Pat. No. 5,351,256, which was issued to Schneider et al on Sep. 27, 1994, describes an electrically injected visible vertical cavity surface emitting laser diode. Visible laser light output from an electrically injected vertical cavity surface emitting laser diode is enabled by the addition of phase matching spacer layers on either side of the active region to form the optical cavity. The spacer layers comprise indium aluminum phosphide which act as charge carrier confinement means. Distributed Bragg reflector layers are formed on either side of the optical cavity to act as mirrors. U.S. Pat. No. 5,351,256 is hereby explicitly incorporated by reference.

U.S. Pat. No. 5,359,447, which was issued to Hahn et al on Oct. 25, 1994, discloses an optical communication with vertical cavity surface emitting laser operating in multiple transverse modes. The communication system uses a relatively large area vertical cavity surface emitting laser. The laser has an opening larger than approximately 8 micrometers and is coupled to a multimode optical fiber. The laser is driven into multiple transverse mode operation, which includes multiple filamentation as well as operation in a single cavity. U.S. Pat. No. 5,359,447 is hereby explicitly incorporated by reference.

In IEEE Photonics Technology Letters, Volume 7, No. 5 (May 1995), an article entitled "200° C., 96-nm Wavelength Range, Continuous-Wave Lasing from Unbonded GaAs MOVPE-Grown Vertical Surface-Emitting Lasers" by Morgan, Hibb-Brenner, Marta, Walterson, Bounnak, Kalweit and Lehman describes record temperature and wavelength range that was attained through the use of MOVPE-grown AlGaAs vertical cavity surface-emitting lasers. Unbonded continuous-wave lasing is achieved at temperatures up to 200° C. from these top-emitting VCSEL's and operation over 96-nm wavelength regime near 850 nm is also achieved from the same nominal design. Temperature and wavelength insensitive operation is also demonstrated in this article and the threshold current is controlled to within a factor of 2 (2.5–5 mA) for a wavelength range exceeding 50 nm and to within 30 percent (5–10 mA) for a temperature range of 190° C. at 870 nm.

As is well known to those skilled in the art, lasers can achieve an output energy that could possibly be dangerous under certain circumstances. For example, certain lasers may achieve an output power that is sufficient to damage the eyesight of an operator if the output light beam of the laser is directed toward the eyes of the operator. Certain low power lasers, which are normally safe if operated within their intended range of performance, can become dangerous if excessive current is caused to flow through them. If, for example, a failure in a portion of a circuit causes excessive current to flow through a laser, that laser can achieve an output power that is sufficient to cause damage to the eyes of an operator even though normal operation of the laser would be inherently safe. For this reason, electrical circuits related to the operation of low power lasers are typically provided with at least one level of protection in which an excessive current through the laser is sensed and acted upon to disable the laser. In certain laser designs, a redundant level of safety is provided by additional circuitry that monitors the first level safety circuit. The provision of eye-safe lasers therefore requires significant effort and significantly complicates the design of the laser module. Moreover, excessive power surges could cause damage to other electronic circuitry, such as receivers, optical ROM or other components. It would therefore be beneficial if an inherently eye-safe and self power limiting laser could be developed that would not permit excessive power output from the laser regardless of other faults that may occur with regard to the circuitry used in conjunction with the laser.

SUMMARY OF THE INVENTION

A laser made in accordance with the preferred embodiment of the present invention comprises an active region and first and second mirror stacks. In a manner known to those skilled in the art, the active region and first and second mirrors, usually formed by multilayer stacks, are designed to emit light at or near a preselected wavelength. The present invention further comprises a power limiting layer, called an increasing absorption layer (IAL) herein, that limits the output power of the light emitted by the laser as a function of an operating parameter of the laser. The power limiting layer is selected for a given laser wavelength so that its absorptivity increases as a function of the increasing operating parameter. The operating parameter can, for example, be the electric current flowing through the laser or the temperature of the laser. The power limiting layer (IAL) also enables use of the laser as an optically bistable gate or switch.

Because of the provision of the IAL of the present invention, an increase in the current flowing through the laser will cause the absorptivity of the IAL to increase sufficiently to inhibit the power output from the laser. The power limiting layer can be disposed but need not be within a preselected one of the first and second mirror stacks.

In a typical vertical cavity surface emitting laser, or VCSEL, made in accordance with the present invention, the laser further comprises a first confinement layer and a second confinement layer. The active region is disposed between the first and second confinement layers and the first and second confinement layers are disposed between the first and second mirror stacks. A first contact layer and a second contact layer are also provided, with the first and second mirror stacks being disposed between the first and second contact layers.

In certain embodiments of the present invention, the first and second mirror stacks comprise a plurality of alternating layers of aluminum gallium arsenide and aluminum arsenide. However, it should be understood that many other types of materials can be used to provide the mirror stacks or cavity required for the laser. The power limiting layer can, for example, be comprised of gallium arsenide. However, it should be clearly understood that the selection of the material used for the power limiting layer is dependent on the wavelength of the emitted light, structure and operating conditions of the laser.

BRIEF DESCRIPTION OF THE DRAWINGS

The present invention will be more fully and completely understood from a reading of the Description of the Preferred Embodiment in conjunction with the drawings, in which.

DESCRIPTION OF THE PREFERRED EMBODIMENT

Throughout the Description of the Preferred Embodiment, like components will be identified by like reference numerals.

Figure 1:
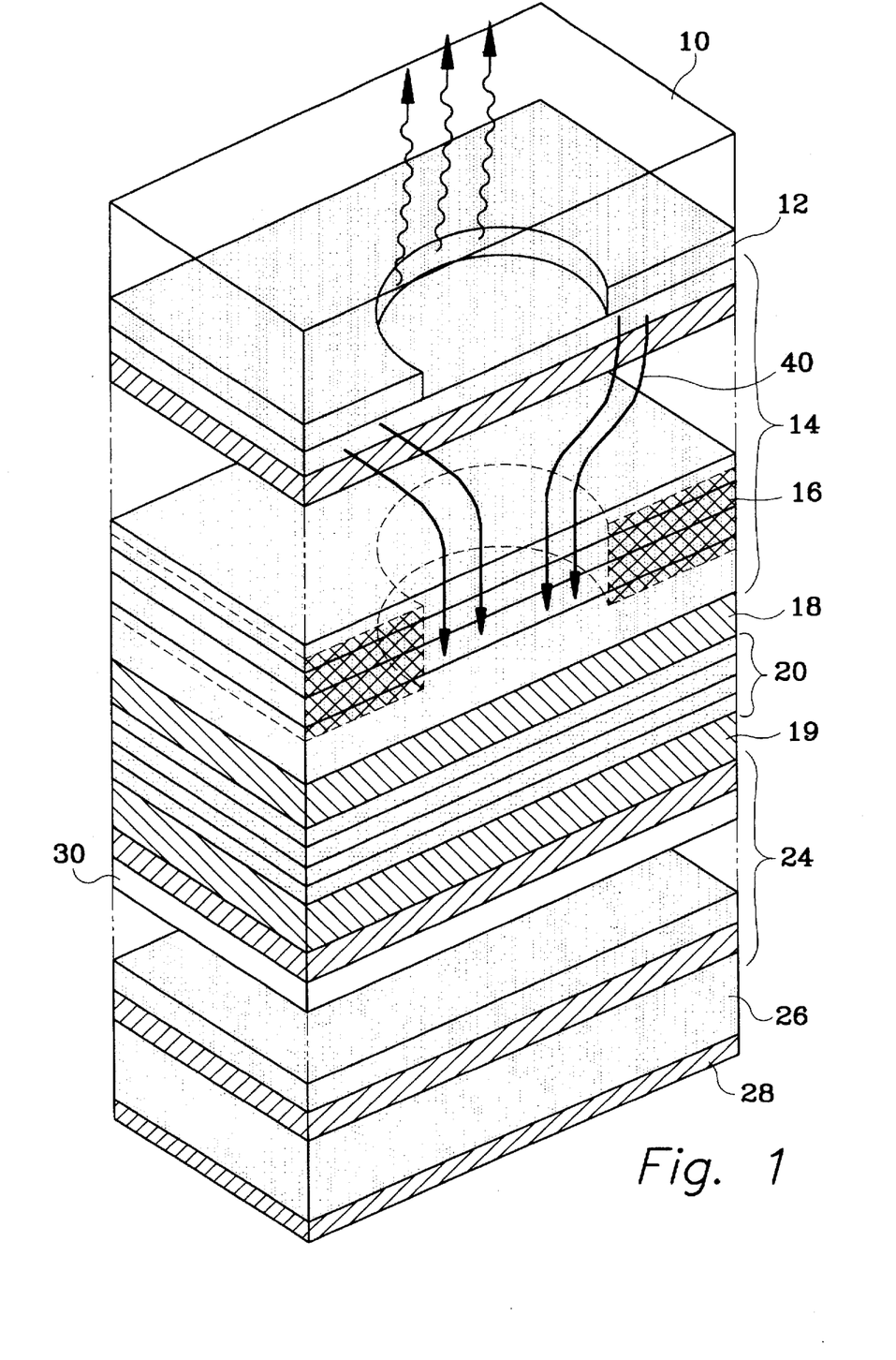
FIG. 1 is a schematic representation of a vertical cavity surface emitting laser with an increasing absorption layer.

FIG. 1 is a schematic illustration of a top surface emitting vertical cavity laser. Beginning at the top portion of FIG. 1, the laser comprises a passivation layer 10 which can be made of an oxide such as silicon dioxide or silicon nitride. Below the passivation layer 10 is a p-contact layer 12 which is typically made of a metallic material such as gold to provide an electrical contact between an external component and the vertical cavity surface emitting laser. A first mirror stack 14 comprises a plurality of quarter wavelength layers of alternating refraction indices specifically selected to facilitate the emission of light at a preselected wavelength. Within the first mirror stack 14, an ion implant layer 16 is provided. As is well known to those skilled in the art, this ion implant allows guidance of the excitation current path to a limited area of the active material. In essence, the implant defines the lasing or emission area. Implantation is one of many ways to achieve current confinement and is used for illustration purposes in the description of the preferred embodiment.

A top confinement layer 18 and a bottom confinement layer 19 are arranged with an active region 20 therebetween. A second mirror stack 24 is disposed below the bottom confinement layer 19. The second mirror stack 24 comprises a plurality of quarter wavelength layers that are specifically selected as a function of the intended wavelength of light of the laser. A substrate 26 and a contact layer 28 are shown at the bottom of FIG. 1. The structure of these layers are well known to those skilled in the art and described in the patents and references discussed above.

In the second mirror stack 24, one of the quarter wavelength layers is specifically selected to act as the absorption layer of the present invention. This increasing absorption layer, or IAL, is identified by reference numeral 30.

Since the structure shown in FIG. 1, except for the IAL 30, is very well known to those skilled in the art and the layers illustrated in FIG. I are each described in significant detail throughout the papers and patents described above, the specific operation of the laser will not be further described herein. The purpose of the increasing absorption layer 30 is to quench the output power of the laser when the current flowing through the laser, and identified in FIG. 1 by reference numeral 40, increases above a predetermined limit. As is well known to those skilled in the art, a laser can possibly achieve an output power above its intended operating power when the current 40 flowing through the laser exceeds the intended magnitude. When the output power emitted by the laser exceeds its intended operating magnitude, the laser's output can achieve levels that might be sufficient to be harmful to the eyesight of an operator. In a laser made in accordance with the present invention, however, an unexpected increase in current flowing through the laser will create a power limiting increase in the absorptivity of the absorption layer 30 and will limit the output power of the light from the laser regardless of the current flowing through the laser. This characteristic of the present invention provides an inherently self-limiting eye-safe laser that does not require extra circuitry to provide this safety measure.

Figure 8:
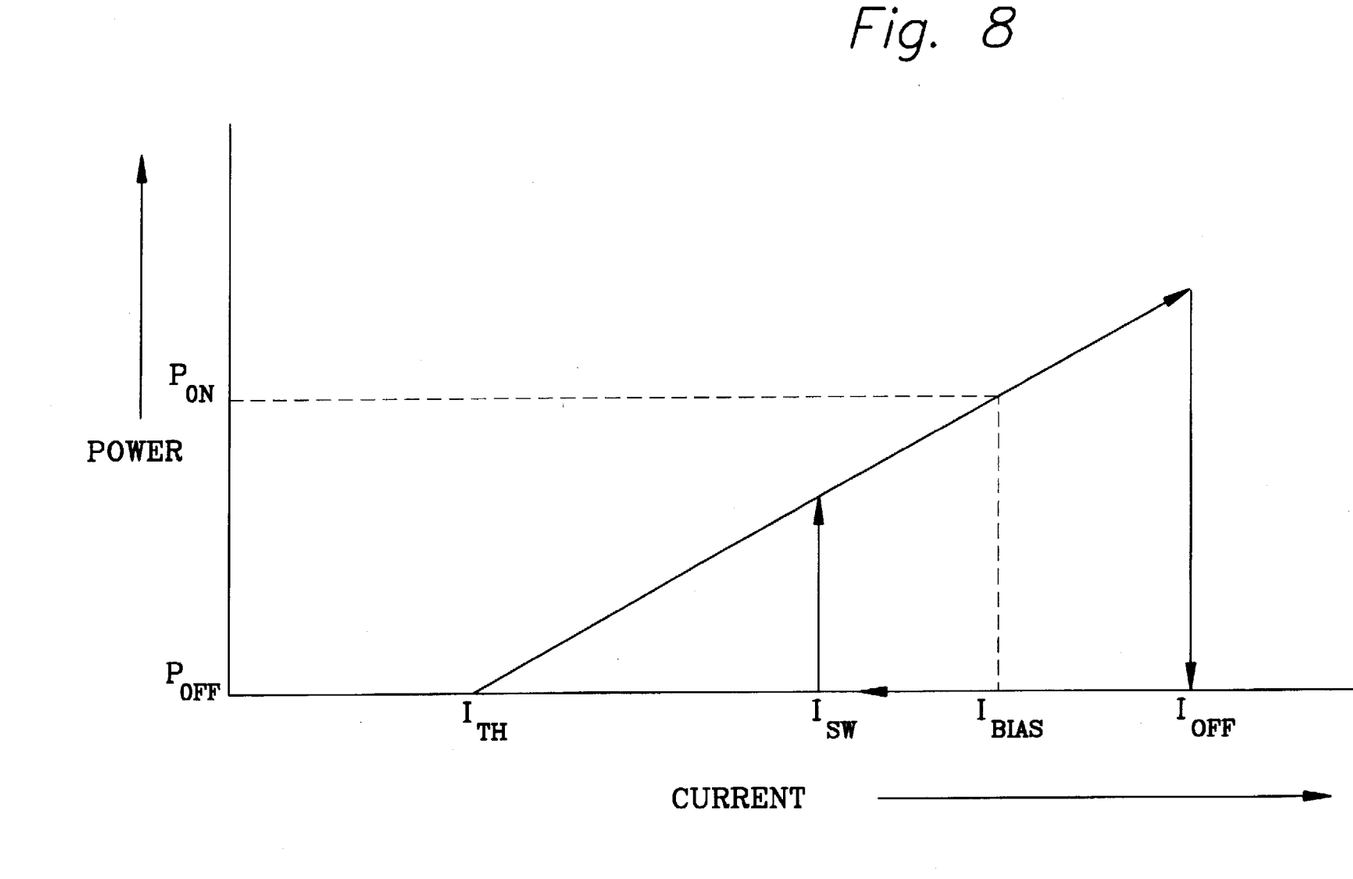
FIG. 8 is a theoretical representation of the ideal operation of a laser made in accordance with the present invention used as an optically bistable logic gate or switch.

Vertical cavity lasers have been known, in concept and prototype demonstrations, since the late 1970's. During the late 1980's, when continuous wave low threshold current VCSEL's were demonstrated at room temperature, practical viability for numerous applications became feasible. Equally important was the developed capability to produce VCSEL's and arrays in a manner consistent with low cost manufacturing approaches. Certain early attempts to fabricate VCSEL wafers were based on standard batch fabrication techniques and the production of devices with adequate performance was expedited with the demonstration of a planar, implanted top emitting structure such as the one shown in FIG. 1. In recent years, high yield and high performance VCSEL's have been manufactured based on extensions of these approaches and this progress has expedited their commercialization. The present invention provides a VCSEL with an increasing absorption layer, or IAL, that is internal to the VCSEL and provides a self limiting and intrinsically eye-safe VCSEL. The provision of the absorption layer 30 reduces the need for costly power monitoring and open loop control circuitry chips that are presently needed for the provision of eye-safety in VCSEL's. The phenomenon of the increasing absorption phenomenon has been the subject of research in semiconductors during the 1980's. Increasing absorption typically results from nonlinearity in the absorption of a semiconductor with increasing optical power. Two examples of mechanisms resulting in increasing absorption are the thermal red shift of a semiconductor bandage with increasing temperature and a many-body effect such as band gap renormalization. The red shift is a thermal nonlinearity and the bandgap renormalization is a carrier effect. The net result is that the absorption increases with increasing optical or current density. This phenomenon provides a positive feedback characteristic. Increasing absorption should also result in a laser gate or switching characteristic as illustrated in FIG. 8. The laser exhibits a hysteretic characteristic in which, depending on the injection current history, the laser may be on at $I_{ON}$ (Power=$P_{ON}$) or off at $I_{OFF}$ (Power=$P_{OFF}$=0) for an injection current of I bias. This characteristic can be exploited to make a bistable or gating VCSEL emitter by biasing the device at $I_{BIAS}$. Increasing the current to a magnitude greater than $I_{OFF}$ will place the laser in the off state for currents above $I_{SW}$, if the injection current stays below $I_{OFF}$, the laser will remain in the on state. Therefore, this VCSEL with an IAL can function as a bistable gate with two distinct states or logic levels for numerous processing and storage applications.

The current dependent absorption coefficient α of a semiconductor material is a function of the absorption coefficient of the material and the current density within the VCSEL. Near a semiconductor bandedge, the absorption coefficient may increase as the current density J increases. Similarly, as the current density J through a laser increases, the localized temperature T within the laser increases. This increase in temperature further increases the absorption coefficient α of the laser.

Throughout the following description of the present invention, the symbols and nomenclature in Table I will be used.

TABLE I

| Symbol | Meaning |
|---|---|
| g | gain or loss per unit length |
| $g_a$ | gain or loss per unit length (absorbing layer) |
| $g_a$ | gain or loss per unit length (active) |
| J | current density (A/cm$^2$) |
| β | spontaneous emission efficiency |
| α | absorption coefficient per unit length |
| $α_c$ | absorption coefficient (cavity) |
| $α_{IA}$ | absorption coefficient (absorbing layer) |
| L | effective length |
| $R_1$ | reflectivity (first mirror) |
| $R_2$ | reflectivity (second mirror) |
| P | power in the cavity |
| Γ | "effective" confinement factor |
| $Γ_a$ | "effective" confineinent factor (active region) |
| $Γ_s$ | "effective" confinement factor (absorbing region) |
| $n_a$ | recombination rate of carriers (active) |
| $n_{a0}$ | recombination rate of carriers (active initial) |
| $n_s$ | recoinbination rate of carriers (absorbing or IAL) |
| $n_{s0}$ | recoinbination rate of carriers (active initial) |
| $V_a$ | active volume |
| $τ_a$ | photon lifetime (active) |
| $τ_s$ | photon lifetime (absorbing layer) |
| $V_s$ | volume of IAL |

The lasing condition states that the effective cavity gain (Γ*g) equals the cavity loss. This can be expressed mathematically as shown below in equation 1. The left side of equation 1 shows that the cavity gain is a function of the confinement factor Γ and the gain per unit length g for the laser. The cavity loss is expressed by the right side of equation 1. The cavity loss is a function of the absorption coefficient $α_c$ which combines together several loss mechanisms such as scattering, free carrier absorption and diffraction loss, the absorption coefficient of the increasing absorption layer $α_{IA}$ which is a function of current density J, temperature T and wavelength λ and the portion of light that is emitted from the laser which is a function of the effective length L of the cavity and the reflectivities, $R_1$ and $R_2$, of the first and second mirror stacks. From equation 1, it can be seen that, as a function of temperature, current density and wavelength, the absorption coefficient of the increasing absorption layer may reach a value where equation 1 is no longer valid and the cavity loss exceeds the cavity gain. If this occurs, lasing is inhibited.

$$Γ^*g = α_c + α_{IA} + 1/(2L^* \ln(R_1^* R_2)) \quad (1)$$

Equation 2 expresses the lasing condition where the losses of the cavity exceed the effective cavity gain (Γ*g). When the condition of equation 2 exists, lasing is not possible and a fast quenching of lasing results. Therefore, the ideal self limiting power-current characteristic is obtained. In the ideal situation, the output power of the laser will increase with increasing current through the laser until the current through the laser causes the absorption of the laser to exceed a value that achieves the condition represented in equation 2. It is assumed that $α_{IA}$ in (2) is greater than $α_{IA}$ in (1). When that occurs, a sudden quenching of the laser will result.

$$α_c + α_{IA} + 1/(2L^* \ln(R_1^* R_2)) > Γ^*g \quad (2)$$

Figure 2:
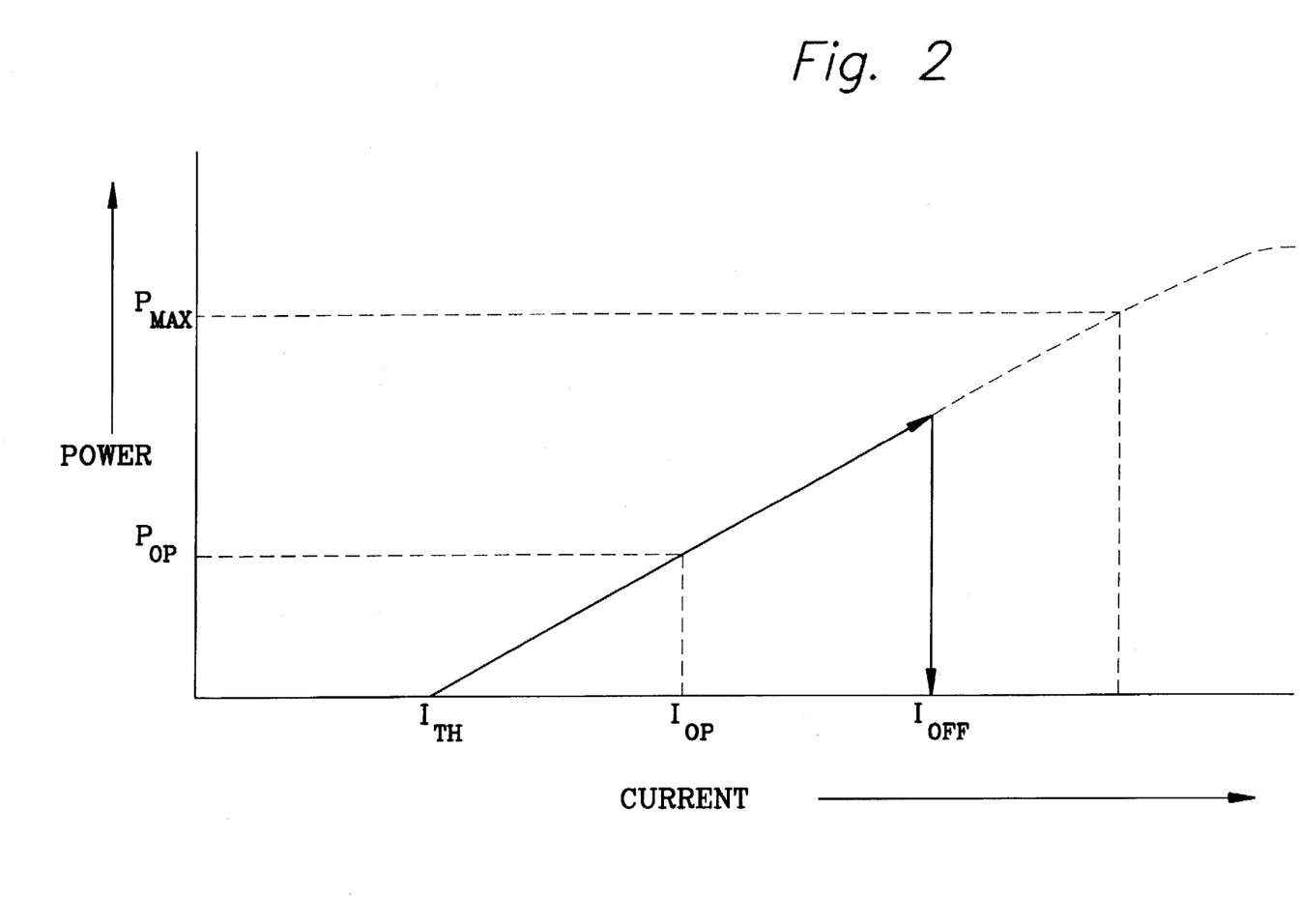
FIG. 2 is a theoretical representation of the ideal operation of a laser made in accordance with the present invention.

FIG. 2 illustrates the theoretical operation of the present invention in a laser operating with an ideal self limiting power-current characteristic. When the current through the laser achieves the threshold magnitude $I_{TH}$, corresponding to equation 1, lasing is initiated and the output power of the laser's emission increases with increasing current. The dashed lines in FIG. 2 represent the operating levels of current $I_{OP}$ and output power $P_{OP}$. If the current increases significantly beyond its operating level, the absorption coefficient of the increasing absorption layer, or IAL, will eventually reach a magnitude that quenches the laser. This current is identified as $I_{OFF}$ in FIG. 2. It should be understood that the relationship between current and power shown in FIG. 2 for an optimally engineered design. Characteristics illustrated in FIGS. 3-6 for the prototype demonstration devices clearly show the quenching effect of the IAL. In contrast, illustrated in FIG. 7, is the characteristic of a like VCSEL, but without an IAL illustrating the phenomenon of thermal rollover. Thermal occurs when the current increases causing the laser temperature to rise consequently and the power output increases more slowly with increasing current until it reaches a point where the output power actually decreases with increasing current through the laser. Numeral 200 represents the rollover current (and corresponding temperature) where the output power begins to decrease with increasing injection current. Numeral 220 represents the point where lasing is actually quenched due to the loss exceeding the gain. Numeral 230 gives the corresponding voltage vs current characteristic. Notably lasing is gradually quenched. This phenomenon is well known to those skilled in the art and is a consequence of gain-resonance detuning and carrier spreading. All lasers exhibit this thermal rollover phenomenon which is distinctly different from IAL self limiting.

A prototype vertical cavity surface emitting laser was manufactured according to the concepts of the present invention. The laser, which is shown schematically in FIG. 1, comprises alternating high and low refractive index layers in the mirror stacks. The high refractive index layers comprise aluminum gallium arsenide ($Al_{0.16}Ga_{0.84}As$). One of the high refractive index layers was replaced with gallium arsenide GaAs which is known to be absorptive for wavelengths less than 865 nanometers. The structure of the VCSEL was nominally designed for operation at a wavelength of 850 nanometers, where gallium arsenide is absorbing. FIGS. 3–6, which will be described in greater detail below, show the results of actual tests performed on this type of laser structure. The laser used for this demonstration comprised a cap contact layer of aluminum gallium arsenide and mirror stacks that each comprises a plurality of individual layers of aluminum arsenide and aluminum gallium arsenide with graded aluminum therebetween. The first mirror stack 14 comprises P-doped layers and the second mirror stack 24 comprises N-doped layers. The laser further comprises an active region with gallium arsenide quantum well layers and aluminum gallium arsenide barrier and confinement layers. The spacer layers also comprise aluminum gallium arsenide. It should be understood that the structure of the VCSEL, other than the increasing absorption layer, can be any alternative structure capable of emitting light at a predetermined wavelength. The materials used to provide the various layers of the VCSEL, their thicknesses and the amount of doping used are not directly related to or dependent on the present invention other than the inclusion of the absorption layer 30 which may be included in one of the numerous layers of the first or second mirror stacks, 14 and 24 or incorporated in the confinement layers, 18 and 19.

The dynamic and steady state properties of the VCSEL made in accordance with the present invention can be engineered in accordance with the equations shown below. Equation 3 describes the change in power density with respect to time. In equation 3, the right side of the equation contains four individual terms. The first term represents the photon power generation. The second and third terms on the right side of equation 3 relate to the decay rate of the optical power. The second term describes the IAL photon loss rate and the third term, the cavity photon loss rate. The third term on the right side of equation 3 is a function of the power and the photon lifetime. The fourth term on the right side of equation 3 represents the generation rate of new photons into the lasing mode due to spontaneous emission.

Equations 4 and 5 represent the change in carrier concentration of the VCSEL active region and the increasing absorption layer, respectively. The first two terms in equation 4 describe the carrier loss rates. The third term in equation 4 represents the carrier generation rate. The IAL carrier density is similarly described in equation 5. It should be noted that the equations below are interrelated, or coupled.

$$dP/dt = (\Gamma_a * g_a(n_a - n_{ao})P) + (\Gamma_s * g_s(n_s - n_{so})P) - (P/\tau_{ph}) + (V_a \beta n_a^2) \quad (3)$$

$$dn_a/dt = -(G_a * g_a(n_a - n_{ao})P/V_a) - (n_a/\tau_a) + (I_a/eV_a) \quad (4)$$

$$dn_s/dt = -(G_s * g_s(n_s - n_{so})P/V_s) - (n_s/\tau_s) \quad (5)$$

Figure 9:
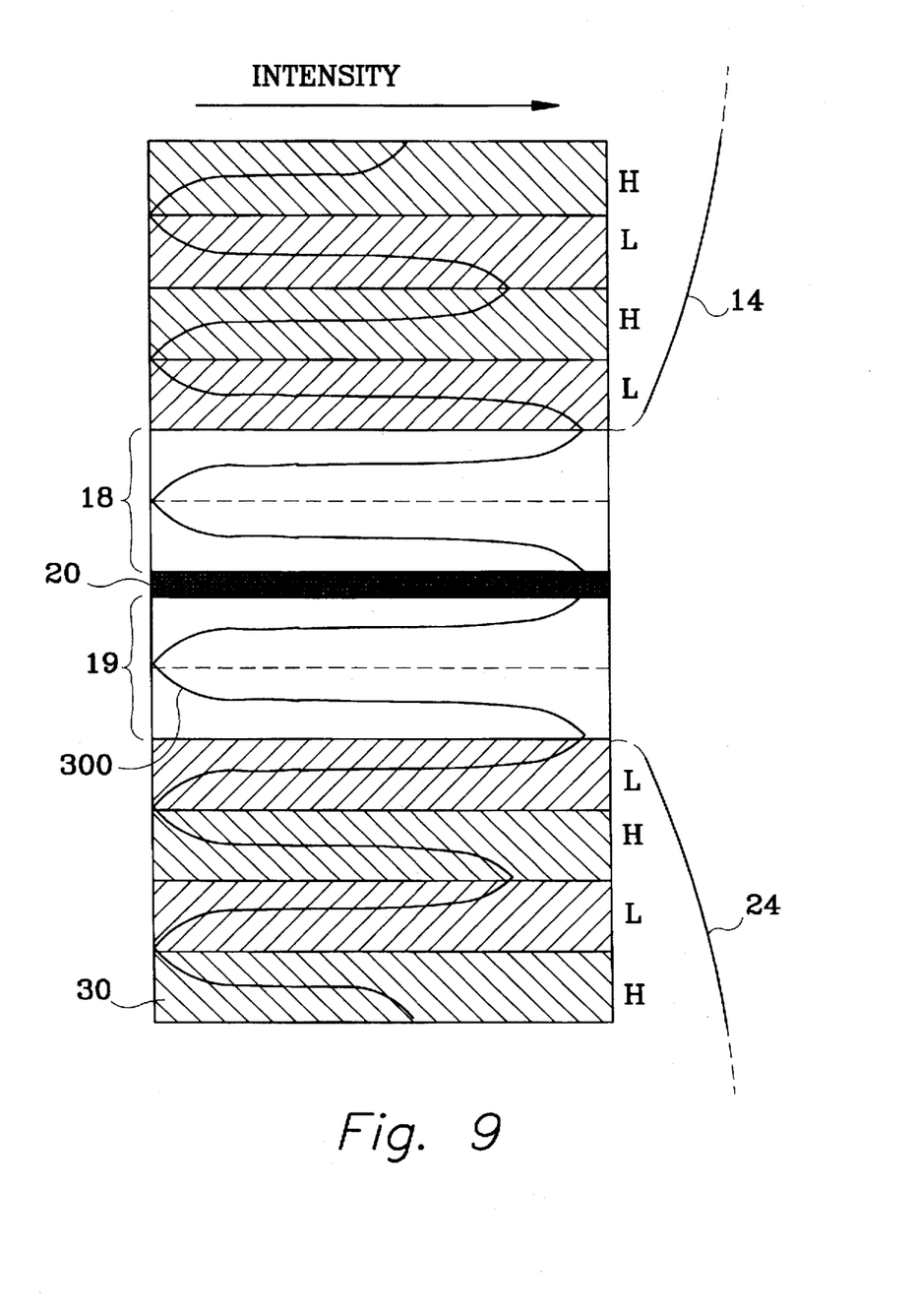
FIG. 9 is a depiction of the optical intensity within the VCSEL layer structure.

The initial carrier density $n_s$ can be changed by doping the increasing absorption layer. Parameters $n_s$ or $g_s$ can also change with increasing injection current magnitudes. In addition, they are also dependent on material and wavelength. Furthermore, the dimensions of the increasing absorption layer, affecting $V_s$ and $\Gamma_s$ can be modified. The size $V_s$ of the increasing absorption layer, or IAL, can be selected in order to affect the current density J and control the quenching current $I_{OFF}$ of the laser. In addition, the placement of the increasing absorption layer, which affects $\Gamma_s$ may be strategically selected to exploit the optical intensity pattern of the laser shown in FIG. 9. The simplest approach to optimize the prototype which is based on the data represented in FIGS. 3–6 is to increase $\Gamma_s$ by placing the IAL closer to the active layer 20 shown in FIG. 1. This exponentially increases $\Gamma_s$ as illustrated in FIG. 9. In addition, $V_s$ can be increased to enhance the effect of the IAL whereby the device switches off in the linear region of the curve similar to the representation in FIG. 2. In FIG. 9, numerals 14 and 24 refer to the top and bottom mirror stacks as in FIG. 1. Numerals 18 and 19 are the spacer regions and 20 the active region. Curve 300 represents the optical intensity within this distributed VCSEL cavity. Layer 30 (or part of it) represents the IAL. Note that the intensity pattern, 300 oscillates and the peak amplitude decreases as the light extends further from the spacer regions 18, 19 and 20. Hence, the greater the overlap between the intensity pattern and the IAL 30, the greater the effective absorption from $V_s$, i.e. $\Gamma_s$ increases.

In the prototype VCSEL described above, which was made for demonstration purposes, the increasing absorption layer was made of gallium arsenide for nominal lasing at 850 nanometers from the top emitting structure. However, it should be noted that the use of a particular material in the prototype does not limit the scope of the present invention. Furthermore, VCSEL's of many different materials, structure and their corresponding emission wavelengths can be modified according to the concepts of the present invention. The increasing absorption layer may be aluminum gallium arsenide for the near infrared wavelengths approximately equal to 850 nanometers and red wavelengths approximately equal to 660 nanometers. These types of 650–700 nanometer VCSELs would typically implement aluminum gallium indium aluminum phosphide active regions. A VCSEL made in accordance with the present invention could utilize indium gallium arsenide quantum wells for VCSELs which lase near one micrometer with the lattice matched to gallium arsenide or, alternatively, indium gallium arsenide phosphide and indium phosphide absorbing regions for VCSELs emitting in the 1.2 micrometer to 1.6 micrometer range. The flexibility of binary, ternary or quaternary type III-V or II-VI semiconductors to change the bandgap for semiconductor lasers is well known to those skilled in the art and will not be described in detail herein.

Figure 3:
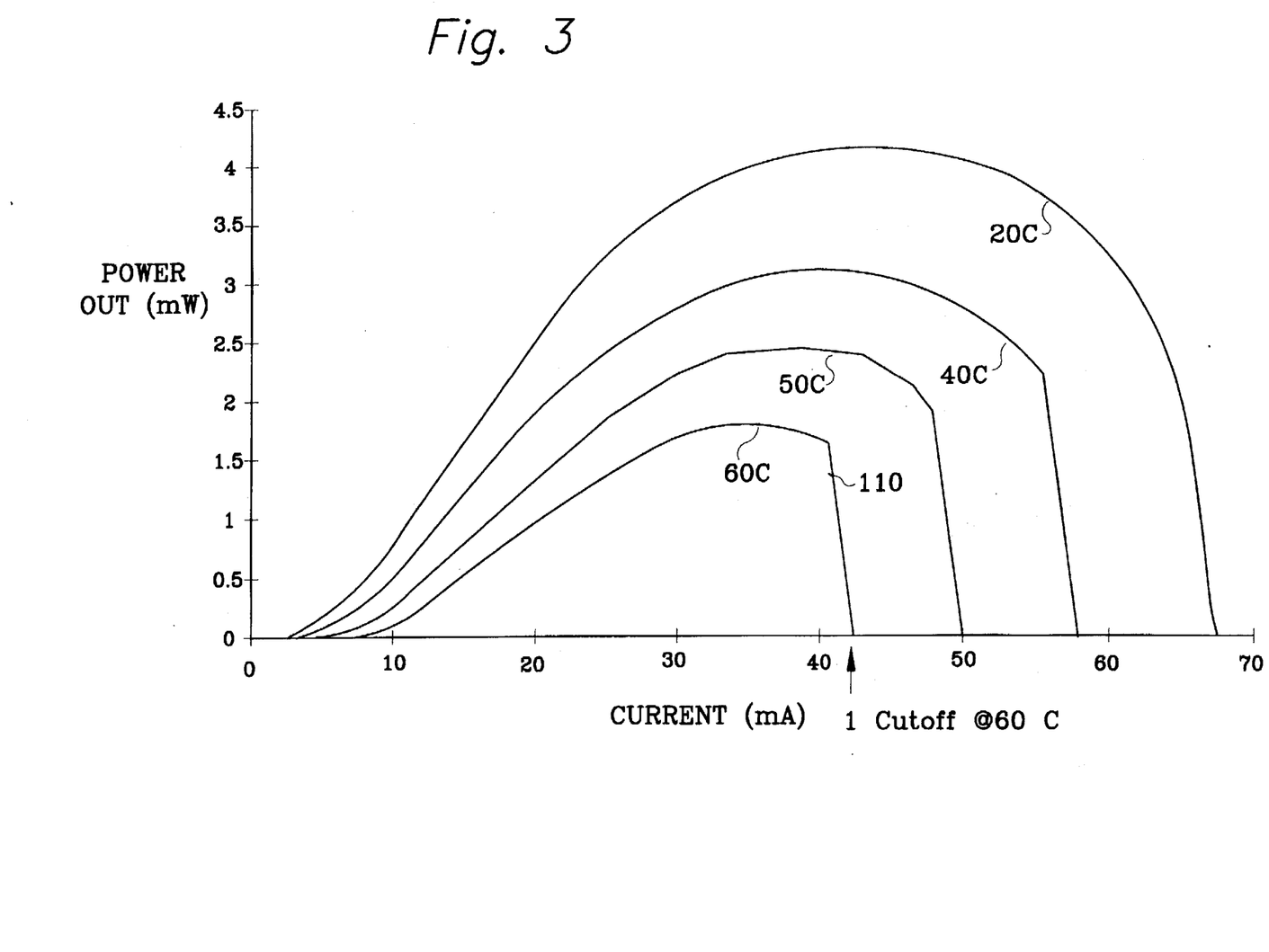
FIGS. 3–6 represent actual empirical data of four vertical cavity surface emitting laser prototypes made in accordance with the present inventions.

FIGS. 3–6 show the results of various measurements taken on prototype VCSEL's made in accordance with the concepts of the present invention. FIG. 3 illustrates the relationship between the output power from the VCSEL and the current flowing through the VCSEL for a vertical cavity surface emitting laser made with a 20 micrometer implant diameter and a 15 micrometer metal opening in the contact layer. The opening in the contact layer serves as an emission aperture for the laser. The VCSEL represented in FIG. 3 was manufactured to emit light at 840.5 nanometers at room temperature. The four lines shown in FIG. 3 represent the operation of the laser at 20 degrees centigrade, 40 degrees centigrade, 50 degrees centigrade and 60 degrees centigrade. With reference to the 20 degree centigrade line, it can be seen that the output power increases as a function of current until the current flowing through the laser reaches approximately 40 milliamperes. Above that magnitude of current, the power gradually decreases due to thermal rollover until lasing is rapidly quenched at slightly less than 70 milliamperes due to the IAL. With reference to the operation of the laser at 60 degrees centigrade, the effect of the IAL is more readily apparent. This results from the increased absorption at higher temperatures for this wavelength. It can be seen that the output power from the laser increases steadily until the current flowing through the laser reaches slightly more than 30 milliamperes and the abrupt quenching can be seen at 42 milliamperes which is more evident than the quenching at 20 degrees centigrade. This onset of quenching is identified by reference numeral 110 in FIG. 3. By comparing FIGS. 2 and 3, it can be seen that the actual results in FIG. 3 are not precisely equal to the ideal characteristic results in FIG. 2. However, the quenching effect of the IAL is clearly evident, particularly as the temperature is increased, wherein the characteristic more closely resembles that of the ideal situation shown in FIG. 2. In other words, laser output power increases with increasing current until the current through the laser reaches a certain magnitude after which the output power is rapidly quenched. In some applications, such as the 60 degree centigrade curve in FIG. 3, the laser quenching is clearly obvious as represented by reference numeral 110 that shows the onset of laser quenching because of the mechanism of increasing absorption rather than because of thermal rollover.

Figure 4:
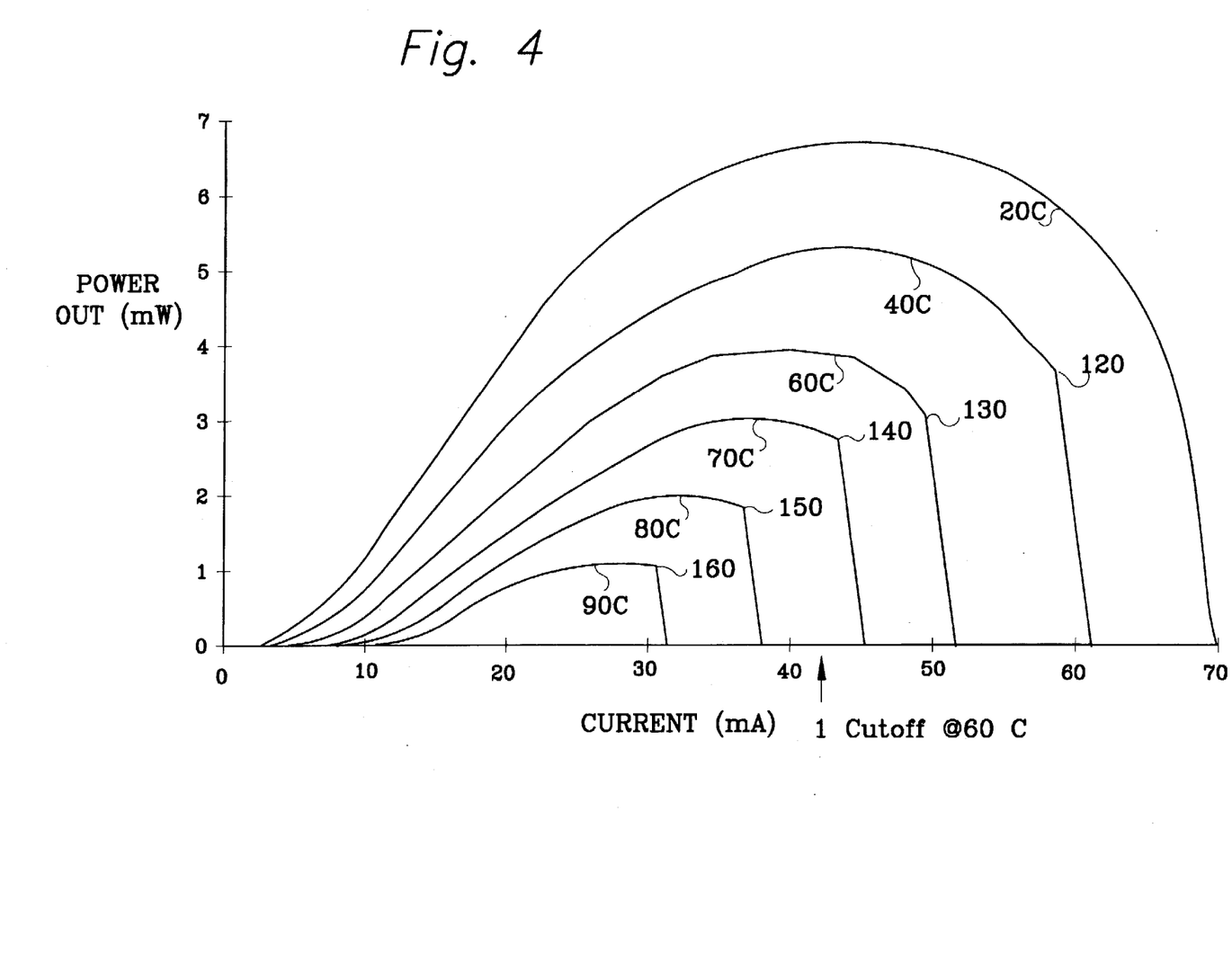

FIG. 4 shows a laser manufactured with a 20 micrometer implant region and a 15 micrometer aperture that was manufactured to emit light at 855.0 nanometers. Each of the lines in FIG. 4 represents a series of tests run at various temperature at indicated. It can be seen that increasing temperature causes the operation of the increasing absorption layer, or IAL, to operate in a manner that more closely resembles the ideal operation illustrated in FIG. 2 indicating that the VCSEL may be engineered to operate more closely to that illustrated in FIG. 2. In FIG. 4, it can be seen that the laser was operated at 20 degrees centigrade, 40 degrees centigrade, 60 degrees centigrade, 70 degrees centigrade, 80 degrees centigrade and 90 degrees centigrade. The onset of quenching for some of the curves in FIG. 4 are identified by reference numerals 120, 130, 140, 150 and 160. In all of the cases shown in FIGS. 3 and 4, it can be seen that increasing current through the laser causes the laser to first reach a threshold current and begin to lase and then increase its output power until a certain magnitude of current is reached. For any given operating temperature, the output power decreases when the current exceeds a certain local temperature and then more abruptly quenches the lasing at a higher current magnitude due to the IAL effect.

Figure 5:
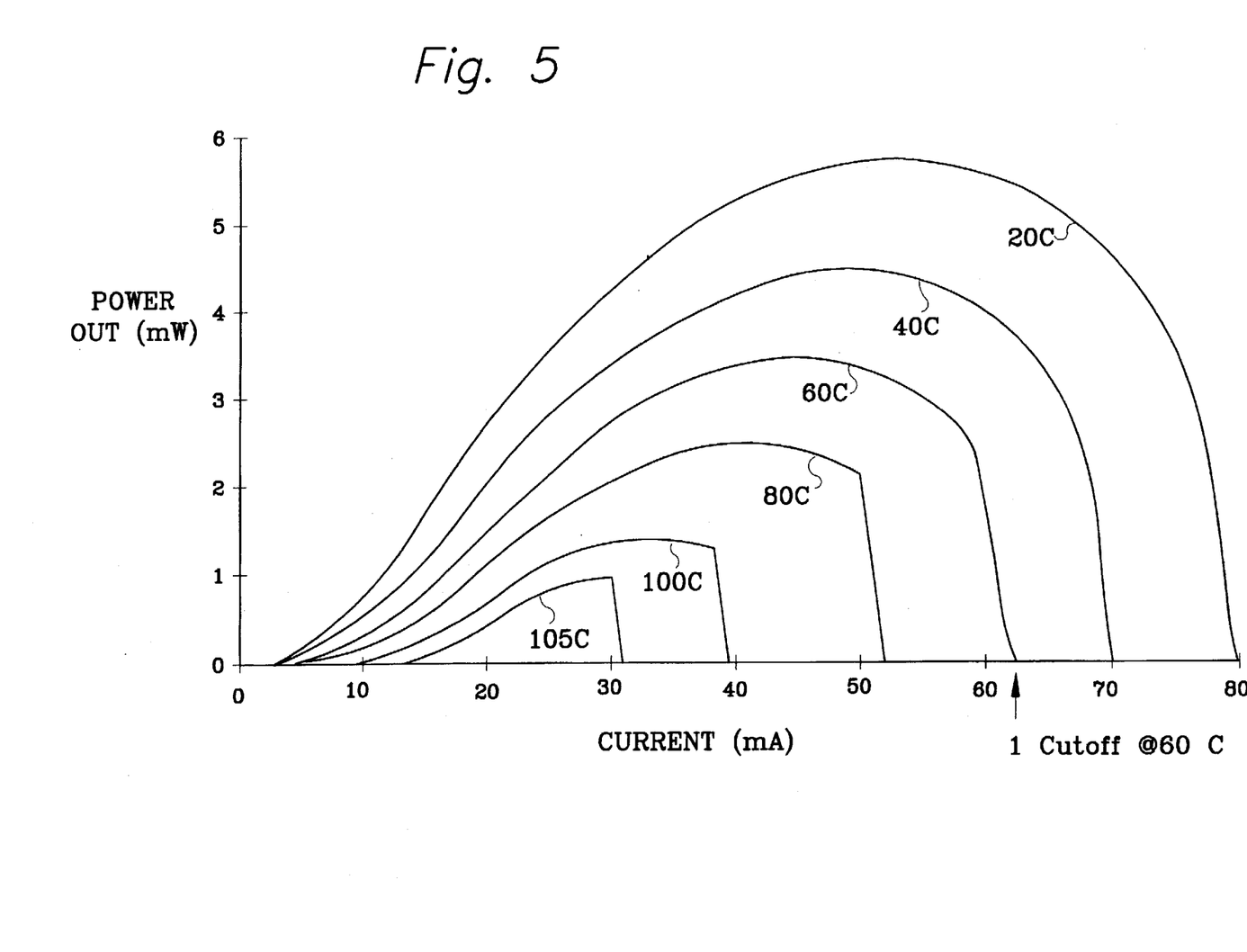
Figure 6:
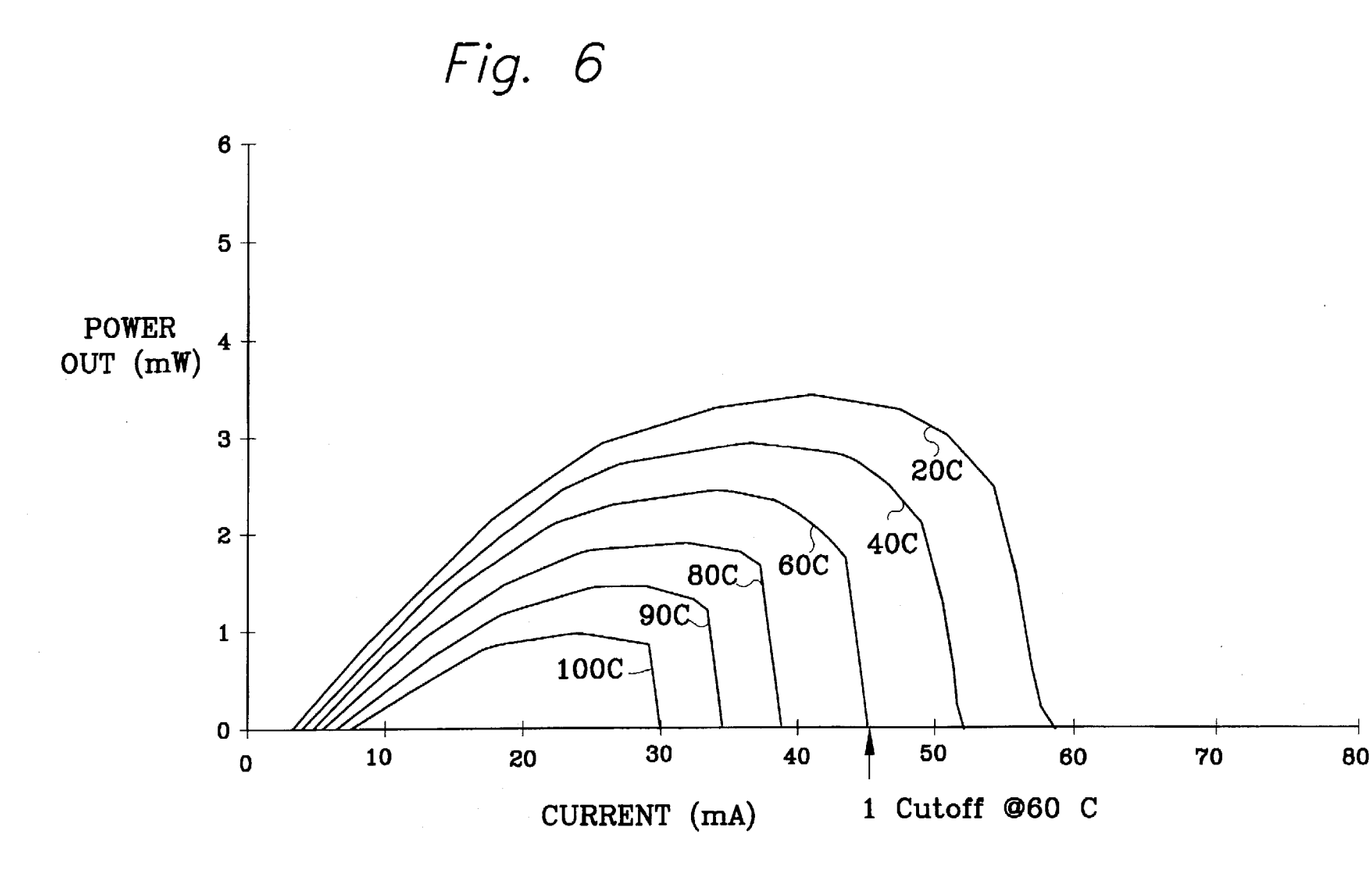
Figure 7:
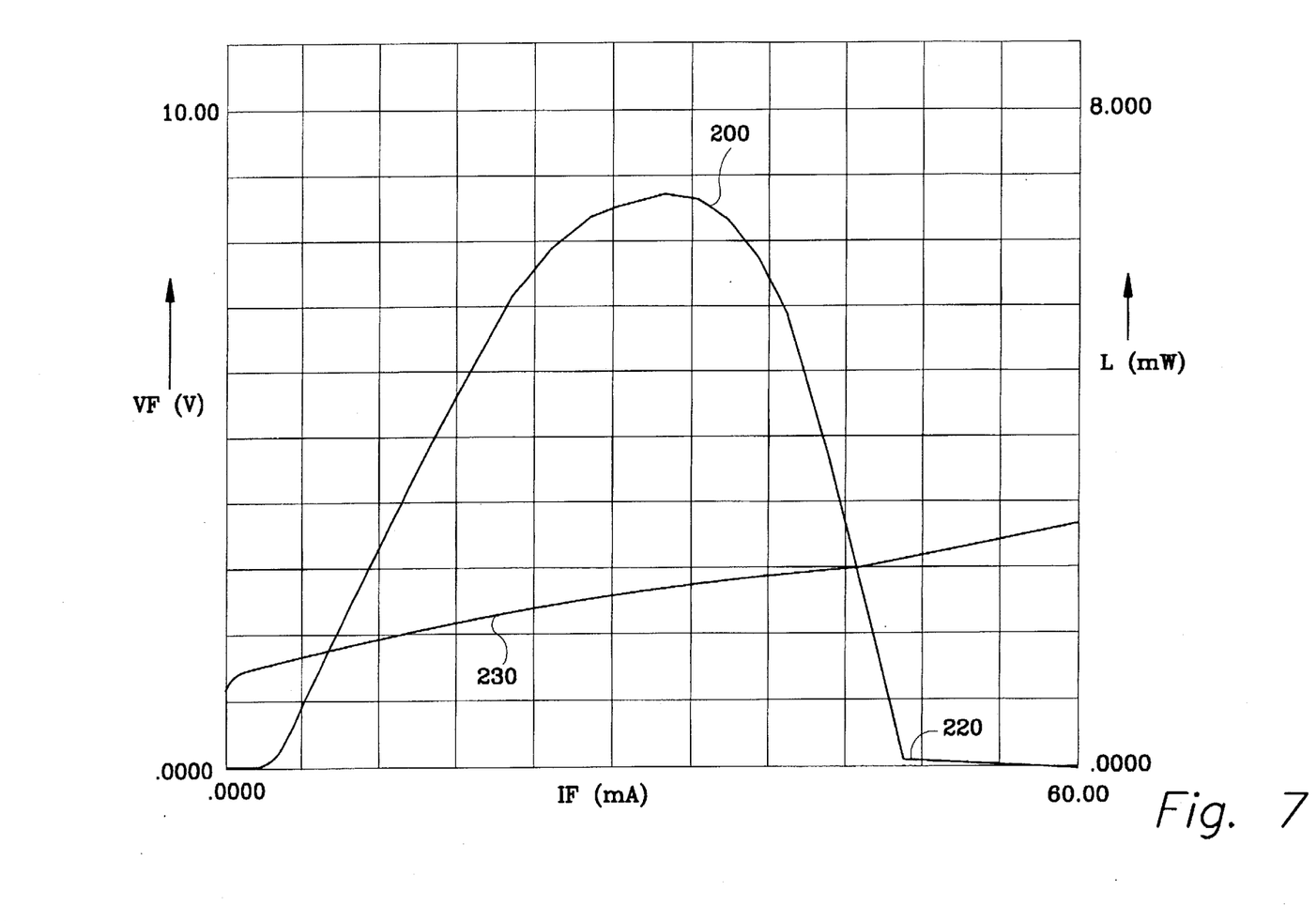
FIG. 7 is a typical empirical measurement of power vs current for a like VCSEL without an IAL, illustrating only gradual quenching of lasing due to thermal rollover.

FIGS. 5 and 6 show the test results for a laser manufactured with an emission wavelength of 863 nanometers. the VCSEL in FIG. 5 was manufactured with a 20 micrometer implant region and a 15 micrometer aperture. The VCSEL in FIG. 6 was smaller, with a 15 micrometer implant and a 10 micrometer aperture. This smaller volume with fixed wavelength illustrates the effect of using volume to approach the ideal characteristics illustrated in FIG. 2 and is shown for the 105 degree centigrade characteristics in FIG. 6.

In each of the curves shown in FIG. 5, increasing current causes an increase in the output power of the laser until a certain magnitude is reached after which the output power decreases and the lasing eventually is quenched, but the 105 degrees centigrade condition appears before thermal rollover indicating that there are conditions under which these lasers can be engineered to behave ideally as shown in FIG. 2.

It is recognized that all materials used in the manufacture of semiconductor lasers can be expected to exhibit some absorptivity at certain wavelengths. In addition, these materials would be expected to exhibit some inhibition of output power at extremely high currents which are above the intended operating level of the lasers. However, the present invention intentionally provides an increasing absorption layer, or IAL, as one of the layers in the first or second mirror stacks for the purpose of advantageously utilizing the increasing absorption coefficient of the IAL to inherently limit the output power of the laser. The material for the IAL is selectively chosen to exhibit the increasing absorption positive feedback at specific current densities and temperatures for a given wavelength of light. As is understood by those skilled in the art, the present invention can be modified for various different wavelengths $\lambda$ of VCSEL operation, various different current densities $J$ and various different temperatures $T$. The selection of material for the IAL, its level of doping and its physical geometry are selected to suit the particular goals of any specific application. The examples described above in conjunction with FIGS. 3–6 are not intended to be limiting to the vast degree of selection opportunity that is made available by the concepts of the present invention.

Ideally, one would design the laser to turn off, or self limit, at power levels less than $P_{MAX}$ set by system specifications. As described above, one would choose the material composition, size, placement and doping in order to engineer the VCSEL to exhibit the ideal characteristic for a given range of wavelengths and operating temperatures. Extrapolating from the trend shown in FIGS. 3–6 and the prototype structure operating near 850 nanometers, it would be appropriate to use the gallium arsenide IAL placed closer to the active region and decrease the size of the laser.

Although the present invention has been described with particular detail and illustrated with specificity to illustrate one particular embodiment of the present invention, it should be understood that alternative embodiments are also within its scope. For example, the mirror layers described above in conjunction with the preferred embodiment of the present invention comprise aluminum gallium arsenide and aluminum arsenide with an increasing absorption layer of gallium arsenide. However, it should be clearly understood that the materials used to manufacture the VCSEL and to provide the increasing absorption layer can be selected of other materials for these purposes. The present invention is only limited to the provision of a layer within the structure of the VCSEL which exhibits an increasing absorption coefficient in response to increasing current through the laser or temperature of the layer. The precise material used to provide the increasing absorption layer is not limiting to the present invention. In addition, although it is preferable to provide the increasing absorption layer as one of the layers of the first or second mirror stacks, it is envisioned that the increasing absorption layer can also be provided in other regions of the laser.

The embodiments of the invention in which an exclusive property or right is claimed are defined as follows:

1. A laser, comprising:
    an active region;
    a first mirror;
    a second mirror, said active region being disposed between said first and second mirrors, said active region and said first and second mirrors being selected to emit light of a preselected wavelength; and
    a power limiting layer that limits the power of said light of said preselected wavelength emitted by said laser as a function of an operating parameter of said laser, said power limiting layer exhibiting a higher increase in absorptivity in response to an increase in said operating parameter than the other layers of said laser.

2. The laser of claim 1, wherein;
    said operating parameter is a current flowing through said power limiting layer.

3. The laser of claim 1, wherein;
    said operating parameter is a temperature of said power limiting layer.

4. The laser of claim 1, wherein;
    said power limiting layer is disposed within a preselected one of said first and second mirrors.

5. The laser of claim 1, further comprising;
    a first confinement layer and a second confinement layer, said active region being disposed between said first and second confinement layers, said first and second confinement layers being disposed between said first and second mirrors.

6. The laser of claim 5, further comprising;
    a first contact layer and a second contact layer, said first and second mirrors being disposed between said first and second contact layers.

7. The laser of claim 6, wherein;
    said first and second mirrors comprise a plurality of alternating layers of aluminum gallium arsenide and layers of aluminum.

8. The laser of claim 7, wherein;
    said power limiting layer comprises gallium arsenide.

9. The laser of claim 1, wherein:
    said laser is a vertical cavity surface emitting laser.

10. A laser, comprising:
    an active region;
    a first mirror;
    a second mirror, said active region being disposed between said first and second mirrors, said active region and said first and second mirrors being selected to emit light of a preselected wavelength; and
    a power limiting layer that limits the power of said light of said preselected wavelength emitted by said laser as a function of an operating parameter of said laser, said power limiting layer exhibiting a higher increase in absorptivity in response to an increase in said operating parameter than the other layers of said laser, said power limiting layer being disposed within a preselected one of said first and second mirrors.

11. The laser of claim 10, wherein;
    said operating parameter is a current flowing through said power limiting layer.

12. The laser of claim 10, wherein;
    said operating parameter is a temperature of said power limiting layer.

13. The laser of claim 10, further comprising;
    a first confinement layer and a second confinement layer, said active region being disposed between said first and second confinement layers, said first and second confinement layers being disposed between said first and second mirrors.

14. The laser of claim 13, further comprising;
    a first contact layer and a second contact layer, said first and second mirrors being disposed between said first and second contact layers.

15. The laser of claim 14, wherein;
    said first and second mirrors comprise a plurality of alternating layers of aluminum gallium arsenide and layers of aluminum.

16. The laser of claim 15, wherein;
    said power limiting layer comprises gallium arsenide.

17. The laser of claim 10, wherein:
    said laser is a vertical cavity surface emitting laser.

18. A laser, comprising:
    an active region;
    a first mirror;
    a second mirror, said active region being disposed between said first and second mirrors, said active region and said first and second mirrors being selected to emit light of a preselected wavelength;
    a power limiting layer that limits the power of said light of said preselected wavelength emitted by said laser as a function of an operating parameter of said laser, said power limiting layer exhibiting a higher increase in absorptivity in response to an increase in said operating parameter than the other layers of said laser, said power limiting layer being disposed within a preselected one of said first and second mirrors, said laser being a vertical cavity surface emitting laser;
    a first confinement layer and a second confinement layer, said active region being disposed between said first and second confinement layers, said first and second confinement layers being disposed between said first and second mirrors; and
    a first contact layer and a second contact layer, said first and second mirrors being disposed between said first and second contact layers, said first and second mirrors comprise a plurality of alternating layers of aluminum gallium arsenide and layers of aluminum, said power limiting layer comprising gallium arsenide.

19. The laser of claim 18, wherein;
    said operating parameter is a current flowing through said power limiting layer.

20. The laser of claim 18, wherein;
    said operating parameter is a temperature of said power limiting layer.

21. The laser of claim 1, wherein;
    said power limiting layer is disposed within a confinement region of said laser.

22. The laser of claim 1, wherein;
    said power limiting layer is bistable.

* * * * *